United States Patent [19]
Kaufman

[11] 4,215,235
[45] Jul. 29, 1980

[54] LEAD FRAME TERMINAL

[76] Inventor: Lance R. Kaufman, 131 White Oak Way, Mequon, Wis. 53092

[21] Appl. No.: 962,586

[22] Filed: Nov. 21, 1978

[51] Int. Cl.² .............................................. H05K 1/12
[52] U.S. Cl. .......................... 174/52 PE; 174/16 HS; 174/68.5; 339/17 E; 357/80; 357/81
[58] Field of Search ............ 174/52 FP, 52 PE, 68.5, 174/16 HS; 339/17 R, 17 C, 17 E, 275 B; 29/628, 627, 629, 577 C, 589; 357/72, 80, 81

[56] References Cited
U.S. PATENT DOCUMENTS

| | | | |
|---|---|---|---|
| 2,991,440 | 7/1961 | Kulka | 174/68.5 X |
| 3,958,075 | 5/1976 | Kaufman | 174/16 HS |
| 4,047,197 | 9/1977 | Schierz | 357/80 X |

*Primary Examiner*—B. A. Reynolds
*Assistant Examiner*—D. A. Tone
*Attorney, Agent, or Firm*—Andrus, Sceales, Starke & Sawall

[57] ABSTRACT

A terminal stud is mounted upon a lead frame element within a modular circuit package. The lead frame element is affixed to a ceramic substrate through a thick film circuit. The terminal stud includes a cylindrical mounting member supported by the lead frame element and an axially extending, cylindrically shaped projection is snugly located within an opening provided by the lead frame element. A solder layer is sandwiched between the terminal stud and the lead frame element while both the solder and the thick film circuit are reflowed for bonding the terminal stud to the lead frame element and the lead frame element to the ceramic substrate in a single operation.

3 Claims, 4 Drawing Figures

LEAD FRAME TERMINAL

BACKGROUND AND SUMMARY OF THE PRESENT INVENTION

The present invention relates to an improved terminal construction including a lead frame element and thick film circuitry.

Such circuitry has come into use with integrated components to complement the small size of these components. Thus lead frame elements and thick film conductors have been applied to ceramic substrates to provide various circuit connections, such as illustrated in U.S. Pat. No. 3,958,075.

The present invention shown in the attached drawing and described in detail below is directed to a lead frame terminal having excellent mechanical strength and stability, electrical connection and current capability, and thermal dissipation.

DETAILED DESCRIPTION OF THE PREFERRED EMBODIMENT

Figure 1:
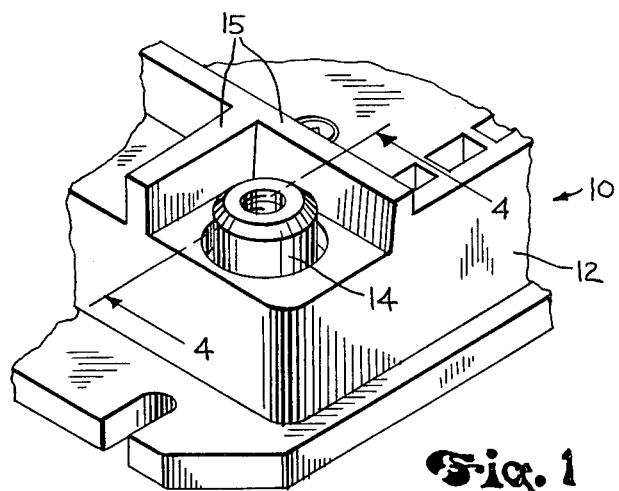
FIG. 1 is a fragmentary perspective view of a circuit package including the terminal combination of the present invention.

In FIG. 1, a circuit package in which the terminal combination of the present invention may be incorporated is indicated by the numeral 10. Circuit package 10 includes housing 12, which may be molded or otherwise appropriately formed, and houses electronic circuitry as hereinafter shown and described in detail. An electrical terminal 14 extends from housing 12 and is connected to the circuitry within housing 12. Appropriate barriers 15 are provided on housing 12 to assist in electrically isolating terminal 14.

Figure 2:
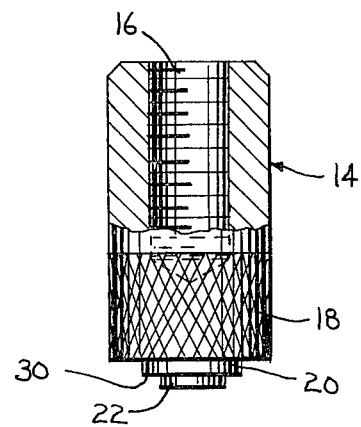
FIG. 2 is a partially broken away side view of the terminal of the combination.

Terminal 14 is shown in detail in FIG. 2 and generally comprises a cylinder formed of brass or other appropriate electrically conductive material. The upper end of terminal 14 is internally threaded, as at 16, for receiving a screw connector while the bottom portion may contain external knurling 18. A disc-like platform 20 is mounted on the lower end of terminal 14. The diameter of this platform 20 is less than that of the upper end of terminal 14. A stud 22 is mounted at the lowermost end of terminal 14 and has a diameter less than that of platform 20.

Figure 3:
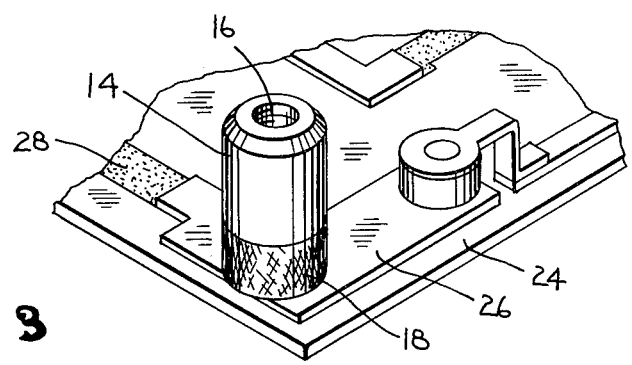
FIG. 3 is a fragmentary perspective view showing the combination of the present invention.

FIG. 3 shows a circuit construction employing a lead frame element and a thick film conductive circuit. Such circuits are further illustrated in U.S. Pat. No. 3,958,075. A substrate 24, preferably comprising a ceramic material, forms the bottom closure of housing 12. A lead frame element 26 is affixed on substrate 24 through a thick film conductive layer 28.

Figure 4:
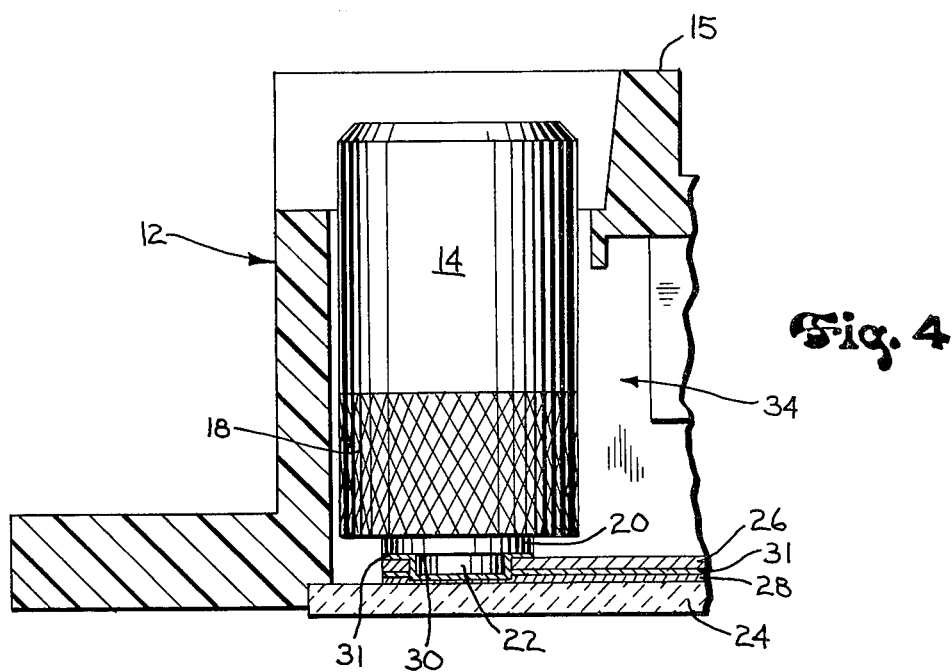
FIG. 4 is a cross-sectional view taken along the line 4—4 of FIG. 1, showing further details of the inventive combination.

A terminal 14 is mounted on the lead frame element 26 as shown in FIG. 3. More particularly, and as shown in FIG. 4, the terminal 14 is mounted on the lead frame element 26 with platform 20 inter-connected to the top of element 26 through a solder layer 31. Stud 22 extends through a mating hole in the lead frame element 26 and electrically engages the thick film circuit 28. For this purpose, the axial length of stud 22 equals, or slightly exceeds, the thickness of lead frame 26. The exposed horizontal surface 30 of platform 20 and the exterior of stud 22 are bonded to the lead frame exterior 26 by the solder 31 to support the stud on the lead frame element 26 in a manner which prevents tipping. Furthermore, such construction enhances the electrical connection of the terminal to the lead frame element by increasing the surface area of contact between the terminal and lead frame element.

The lower end of stud 22 is bonded to the thick film circuit 28 through the solder 31 to provide further support for terminal 14. The structure permits simultaneous bonding of platform 20 to lead frame element 26, the lead frame element 26 to substrate 24, and the stud 22 to substrate 24 by reheating the terminal combination after assembly for reflowing to the solder layer 31 the thick film circuit 28. Such assembly is advantageously used in conjunction with a heat dissipating element mounted to the bottom surface of ceramic 24 for superb heat transfer operation.

An encapsulating or potting material (not shown) is customarily injected into the chamber 34 and firmly engages the knurling 18 to further provide support for terminal 14 to maintain the secure connection with the lead frame element 26.

Various modes of carrying out the invention are contemplated as being within the scope of the following claims particularly pointing out and distinctly claiming the subject matter which is regarded as the invention.

I claim:

1. A lead frame terminal, comprising an electrically non-conductive heat dissipating substrate, a lead frame element connected to said substrate through a thick film circuit, a terminal stud having means for mounting said stud to said lead frame element, said mounting means including a mounting member and an axially extending projection located at an axial end of said stud adjacent said lead frame element with said mounting member supported by said lead frame element and said axial projection snugly located within a mating opening within said lead frame element, and reflowable electrically conductive material bonding said mounting member to said lead frame element and said axial projection to said substrate and providing a sturdy inter-connection with good heat transfer to said substrate.

2. The terminal of claim 1, wherein said mounting member is cylindrically formed with a first predetermined diameter and said axial projection is cylindrically formed with a second predetermined diameter less than said first diameter.

3. The terminal of claim 1, and including a housing engaging said substrate and forming a chamber around a portion of said terminal stud, said stud including knurling for firmly engaging an encapsulate within said chamber and inter-connecting said stud to said housing.

* * * * *